US011104278B2

(12) United States Patent
Polak

(10) Patent No.: US 11,104,278 B2
(45) Date of Patent: Aug. 31, 2021

(54) CONTROL PANEL FOR MOTOR VEHICLE

(71) Applicant: Aptiv Technologies Limited, St. Michael (BB)

(72) Inventor: Andrzej Polak, Huerth (DE)

(73) Assignee: Aptiv Technologies Limited, St. Michael (BB)

( * ) Notice: Subject to any disclaimer, the term of this patent is extended or adjusted under 35 U.S.C. 154(b) by 406 days.

(21) Appl. No.: 15/970,950

(22) Filed: May 4, 2018

(65) Prior Publication Data
US 2018/0334107 A1  Nov. 22, 2018

(30) Foreign Application Priority Data

May 18, 2017 (FR) ...................................... 1754424

(51) Int. Cl.
*B60R 11/02* (2006.01)
*H05K 1/11* (2006.01)
(Continued)

(52) U.S. Cl.
CPC .......... *B60R 11/0264* (2013.01); *B60K 35/00* (2013.01); *B60K 37/02* (2013.01);
(Continued)

(58) Field of Classification Search
CPC ............................ B60R 11/0264; B60K 37/06
(Continued)

(56) References Cited

U.S. PATENT DOCUMENTS 5,521,342 A * 5/1996 Bartley et al. ......... H01H 13/70
200/5 R
8,432,678 B2 * 4/2013 McClure et al. ......... G06F 1/16
361/679.3
(Continued)

FOREIGN PATENT DOCUMENTS

CN 101923971 12/2010
CN 103619637 3/2014
(Continued)

OTHER PUBLICATIONS

"Foreign Office Action", CN Application No. 201810454443.6, dated Dec. 17, 2020, 12 pages.

*Primary Examiner* — Renee S Luebke
*Assistant Examiner* — Iman Malakooti
(74) *Attorney, Agent, or Firm* — Colby Nipper PLLC

(57) ABSTRACT

A control panel for motor vehicle includes a mount; a printed circuit board, which is fastened on the mount; a facade element, which is assembled on the mount and which covers the printed circuit board; the facade element comprising at least one actionable control key, which is integral with a fixed part of the facade element and which extends above a zone of the printed circuit board; the control key including an end joining the fixed part of the facade element and a mobile free end; the control key includes at its joining end a first protuberance bearing against the mount and/or against the printed circuit board, and includes at its free end a pressing zone provided to be touched by an operator with a view to actuating the control key; the control key also (Continued)

includes a second protuberance arranged between the first protuberance and the pressing zone, said second protuberance having a lesser height than the first protuberance and including at its free end opposite the printed circuit board a bearing surface provided to come into contact with a sensor arranged opposite on the printed circuit board when the control key is actuated.

19 Claims, 3 Drawing Sheets

(51) Int. Cl.
| | |
|---|---|
| H01H 13/78 | (2006.01) |
| G05G 1/02 | (2006.01) |
| B60K 37/06 | (2006.01) |
| B60K 35/00 | (2006.01) |
| H01H 13/14 | (2006.01) |
| H01H 13/02 | (2006.01) |
| H03K 17/96 | (2006.01) |
| H01H 3/12 | (2006.01) |
| B60K 37/02 | (2006.01) |

(52) U.S. Cl.
CPC .............. *B60K 37/06* (2013.01); *G05G 1/02* (2013.01); *H01H 3/12* (2013.01); *H01H 13/02* (2013.01); *H01H 13/14* (2013.01); *H01H 13/78* (2013.01); *H03K 17/96* (2013.01); *H03K 17/962* (2013.01); *H03K 17/964* (2013.01); *H05K 1/11* (2013.01); *B60K 2370/128* (2019.05); *B60K 2370/139* (2019.05); *B60K 2370/143* (2019.05); *B60K 2370/145* (2019.05); *B60K 2370/1446* (2019.05); *B60K 2370/1468* (2019.05); *D05D 2205/08* (2013.01); *H03K 2217/96054* (2013.01); *H03K 2217/96062* (2013.01)

(58) Field of Classification Search
USPC .................................................. 200/5 A, 314
See application file for complete search history.

(56) References Cited

U.S. PATENT DOCUMENTS

| | | | |
|---|---|---|---|
| 2009/0173613 | A1 | 7/2009 | Geldmacher |
| 2010/0314229 | A1* | 12/2010 | Ominato ................ H01H 13/02 200/314 |
| 2015/0043193 | A1* | 2/2015 | Chiba ..................... H01H 9/18 362/23.05 |
| 2016/0046190 | A1 | 2/2016 | Kim |

FOREIGN PATENT DOCUMENTS

| | | |
|---|---|---|
| CN | 104303247 | 1/2015 |
| CN | 204204708 | 3/2015 |
| CN | 105281737 | 1/2016 |
| CN | 205194585 | 4/2016 |
| CN | 205428785 | 8/2016 |
| EP | 3018562 | 5/2016 |

\* cited by examiner

CONTROL PANEL FOR MOTOR VEHICLE

TECHNICAL FIELD OF INVENTION

This disclosure generally relates to a control panel for motor vehicle and more particularly, the control keys of such a panel.

BACKGROUND OF INVENTION

The occupants of a motor vehicle are very aware of the visual appearance and feel of the control keys of a control panel. A control key generally comprises a cap fixed in guiding elements that can move along guiding elements in a housing. The outer surface of this cap is generally painted and the graphic symbol is engraved with a laser. A guiding element is manufactured in plastic as a separate part and the cap is assembled to it by means of clipping features. The assembly is guided in the housing by means of sliding or rotating bearings. In order to improve tactile feedback and reduce the risk of control key jamming, grease is often distributed on the sliding surfaces so as to reduce sliding friction. When pushed by a user, the control key supplies an input in the sense of activating a microswitch so as to create the rest/activated state. The control panels that are equipped with such control keys are generally bulky and complicated to manufacture. It is therefore important to propose a new solution for resolving these problems.

SUMMARY OF THE INVENTION

A control panel for motor vehicle comprises a mount, a printed circuit board, which is fastened on the mount, a facade element, which is assembled on the mount and which covers the printed circuit board; the facade element comprising at least one actionable control key, which is integral with a fixed part of the facade element and which extends above a zone of the printed circuit board; the control key including an end joining the fixed part of the facade element and a mobile free end. The control key includes at its joining end a first protuberance bearing against the mount and/or against the printed circuit board, and includes at its free end a pressing zone provided to be touched by an operator with a view to actuating the control key; the control key also includes a second protuberance arranged between the first protuberance and the pressing zone, said second protuberance having a lesser height than the first protuberance and including at its free end opposite the printed circuit board a bearing surface provided to come into contact with a sensor arranged opposite on the printed circuit board when the control key is actuated.

The embodiment of control keys integral in the control panel and having a control key structure comparable with a lever arm is a simple and efficient solution for allowing the manufacture of a control panel of slight thickness.

The printed circuit board can include a cutout forming an elastic strip on which the sensor is arranged. The mount can include a bump arranged to bear against the printed circuit board and arranged beneath the sensor. The control key can comprise a zone of reduced thickness between the first protuberance and the second protuberance so as to facilitate flexion of the pressing zone when the control key is actuated. The zone of reduced thickness can comprise a profile of diminishing thickness from the second protuberance to the first protuberance.

A light source can be arranged on the printed circuit board opposite the pressing zone and a cavity forming a light guide can be arranged in the thickness of the control key beneath the pressing zone so as to be able to illuminate a pictogram arranged on the pressing zone.

The control key can comprise a third protuberance arranged beneath the free end of the control key and having its free end distant from the printed circuit board so as to form a stop against the printed circuit board when the control key is actuated.

An elastic capacitive detection element can be arranged interposed between the pressing zone of the control key and the printed circuit board, the elastic capacitive detection element being arranged in contact with the control key and electrically connected to the printed circuit board so as to detect a touch of the control key by an operator. The sensor can be a force sensor arranged in contact with the bearing surface of the second protuberance. The force sensor can simultaneously be a tactile sensor and a haptic actuator.

The facade element can comprise a plurality of control keys aligned edge to edge consecutively one after the other such that their joining ends are aligned with each other in a rectilinear manner and such that their free ends are aligned with each other in a rectilinear manner; and two consecutive control keys can be separated by a hollowing of the facade element extending from their free ends up to their joining ends.

The facade element can comprise a plurality of control keys aligned edge to edge consecutively one after the other such that their joining ends are aligned with each other in a rectilinear manner and such that their free ends are aligned with each other in a rectilinear manner; and two consecutive control keys can be separated by a groove of the facade element extending from their free ends up to their joining ends.

A roof electronic module for motor vehicle interior can comprise the control panel described above.

Other aims and advantages of the present invention will emerge in the light of the description that follows.

BRIEF DESCRIPTION OF DRAWINGS

Other characteristics, aims and advantages of the invention will emerge on reading the detailed description that will follow, and in the context of the attached drawings, given as a non-limitative example and on which.

DETAILED DESCRIPTION

Figure 1:
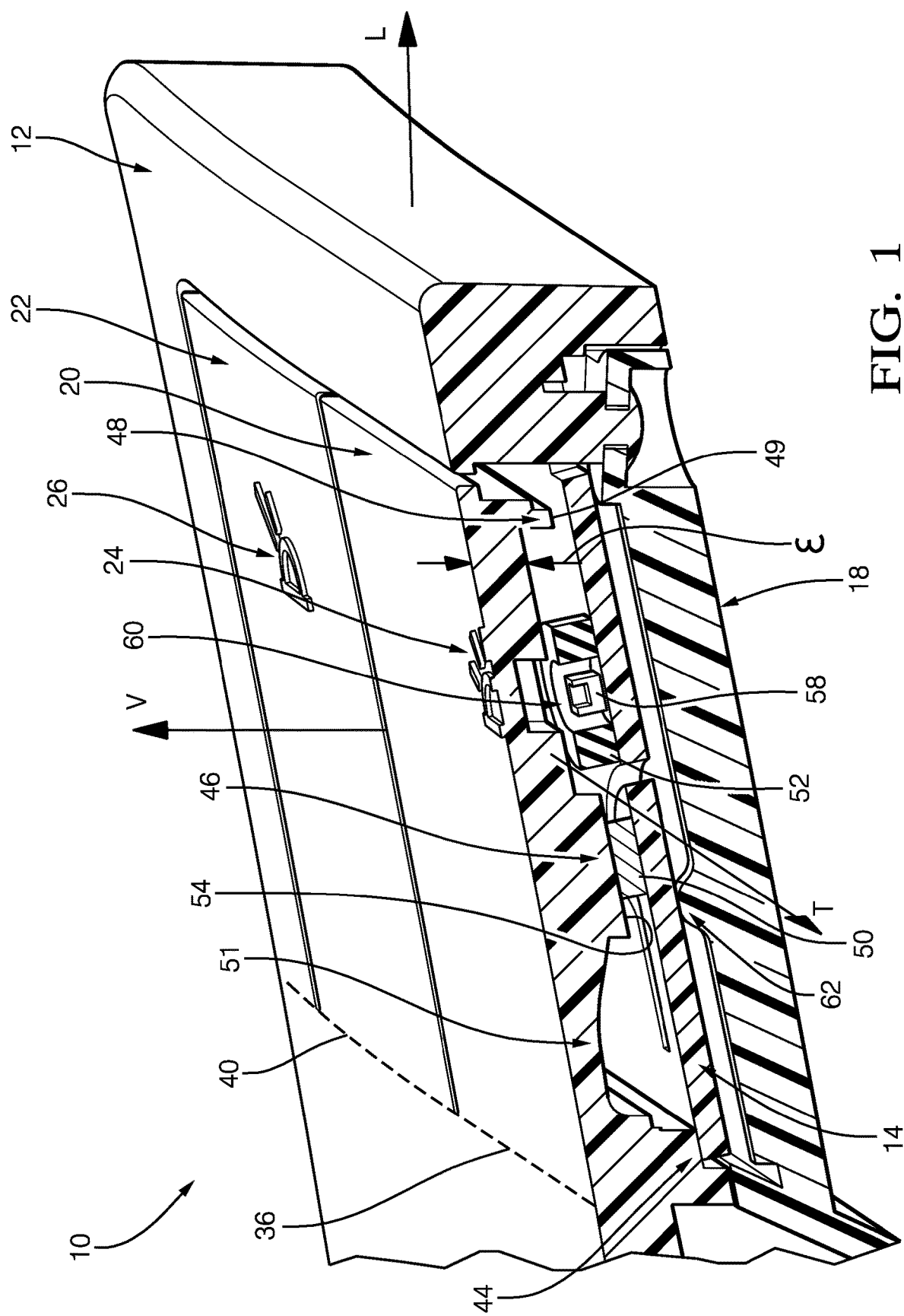
FIG. 1 is a partial diagrammatic view in perspective and in cross-section of a control panel according to the invention, two control keys of which have been illustrated.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

So as to simplify the description, and in a non-limitative manner, a system of coordinates is defined that comprises a longitudinal axis L, a transversal axis T and a vertical axis V. Orientations "low", "high", "above" "below", "lower" and "upper" are defined along the vertical direction. Orientations "left", "right" and "lateral" are defined along the transversal direction. Orientations "front" and "rear" are also defined along the longitudinal direction.

Figure 2:
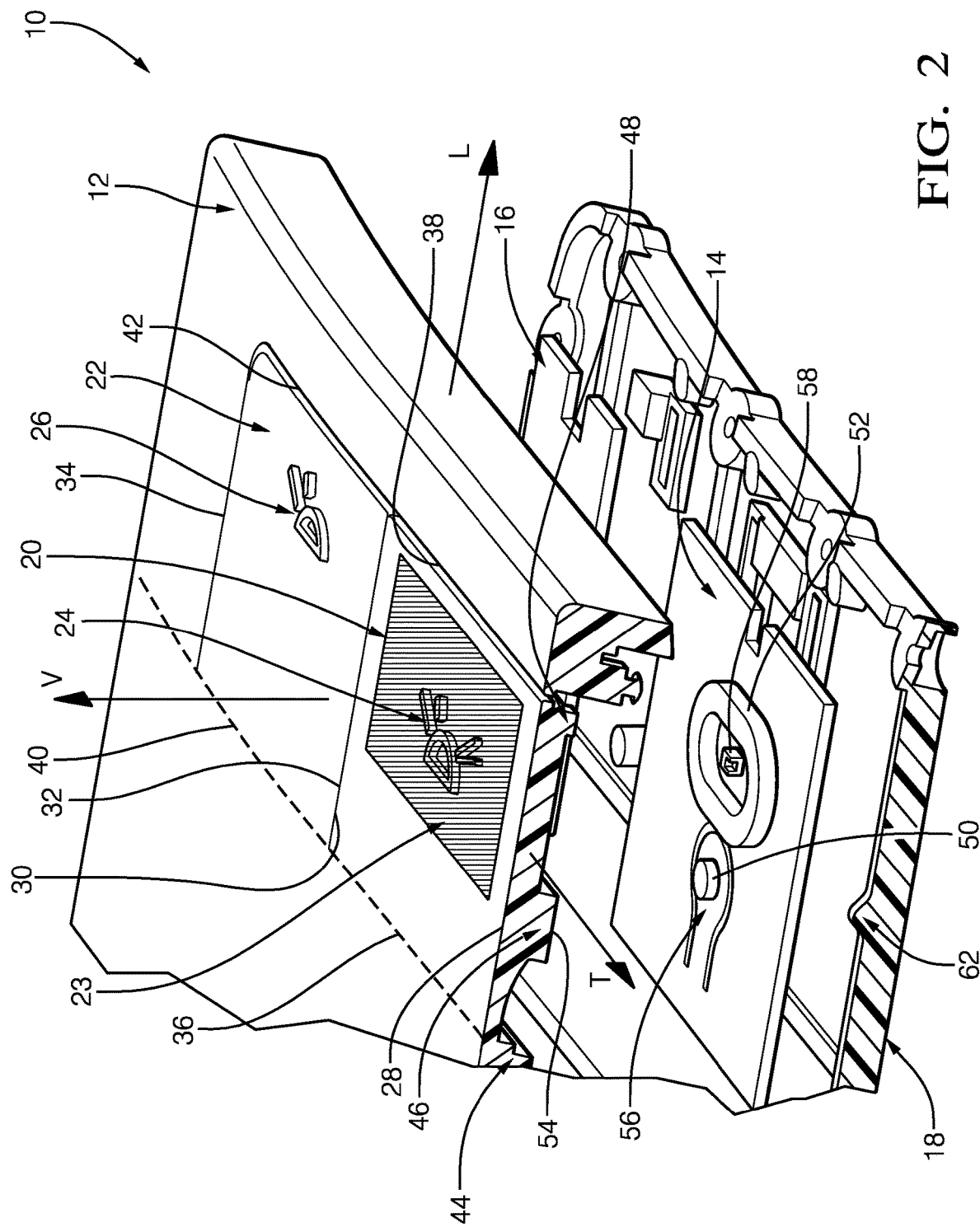
FIG. 2 is an exploded diagrammatic view in perspective of FIG. 1.

According to FIG. 1 and FIG. 2, a control panel 10 for motor vehicle comprises a facade element 12 accessible to an operator, printed circuit boards 14, 16 and a mount 18 on which the printed circuit boards 14, 16 are fastened. Globally, the facade element 12 is equipped with control keys 20, 22, beneath which the printed circuit boards 14, 16 are arranged. One of the control keys 20 of FIG. 1 has been deliberately cut so as to distinguish clearly certain details of the embodiment illustrated by FIG. 1 and FIG. 2.

The control keys 20, 22 of the illustrated control panel 10 are actionable control keys 20, 22, which are integral with a fixed part of the facade element 12. Each control key 20, 22 comprises a pressing zone 23 materialized by the presence of a pictogram 24, 26. The two illustrated control keys 20, 22 are arranged as a row, that is to say disposed consecutively next to each other along the transversal direction. Each control key 20, 22 is globally of a rectangular shape. Each control key 20, 22 is delimited by its two lateral edges 28, 30, 32, 34 and by its two longitudinal edges.

According to the invention, the lateral edges 28, 30, 32, 34 of each control key 20, 22 are delimited by a hollowing of material of the facade element 12. In other words, the two control keys 20, 22 are separated from each other by a longitudinal opening delimiting their adjacent lateral edges 30, 32. The other lateral edge 28, 34 of each control key 20, 22 is also delimited by another hollowing of material of the facade element 12, each forming another longitudinal opening.

One of the longitudinal edges of each control key 20, 22 is integral, i.e. in continuity of material, with the facade element 12. The longitudinal edge of each control key 20, 22 in continuity of material with the facade element 12 defines a joining end 36, 40 between the control key 20, 22 and the facade element 12. The joining ends 36, 40 of the two control keys 20, 22 are identified on FIG. 2 by dotted lines. The other longitudinal edge of each control key 20, 22 is delimited by a transversal opening. In other words, the other longitudinal edge of each control key 20, 22 is not coupled to the facade element 12. The longitudinal edge of each control key 20, 22 delimited by a transversal opening defines a free end 38, 42 of the control key 20, 22.

According to FIG. 1 and FIG. 2, the longitudinal edges of the control keys 20, 22 are aligned with each other along the transversal direction. More particularly, the joining ends 36, 40 are aligned with each other in a rectilinear manner along the transversal direction and the free ends 38, 42 delimited by the transversal opening are also aligned with each other in a rectilinear manner along the transversal direction.

The pictogram 24, 26 of each control key 20, 22 is arranged sufficiently close to the free end 38, 42 of each control key 20, 22 such that the pressing zone 23 defined by the pictogram 24, 26 is a zone adjacent to the free end 38, 42 of each control key 20, 22. Due to the hollowing of material of the facade element 12 around each control key 20, 22, pressing the pressing zone 23 of a control key 20, 22 can enable a depression of the control key 20, 22, triggering the activation of a function of the vehicle.

Alternatively, the longitudinal opening delimiting the adjacent lateral edges 30, 32 of the two control keys 20, 22 can be replaced by a single longitudinal groove made by a reduction of thickness of the facade element 12 between their adjacent lateral edges 30, 32. In other words, two adjacent control keys 20, 22 are linked to each other by the groove. In this case, the application of a force on the pressing zone 23 of one of the two control keys 20, 22 also causes a depression of the other control key 20, 22.

The thickness along the vertical axis of each control key 20, 22 is not constant. Each control key 20, 22 includes at its joining end 36, 40 a first protuberance 44 bearing against the mount 18 and against the printed circuit board 14, 16 arranged beneath the control key 20, 22. Each control key 20, 22 also includes a second protuberance 46 arranged between the first protuberance 44 and the pressing zone 23. Each control key 20, 22 furthermore comprises a third protuberance 48 arranged beneath the free end of the control key 20, 22, forming a stop against the printed circuit board 14, 16 when the control key 20, 22 is actuated.

The first protuberance 44 extends transversally along the entire length of the joining end 36, 40 of the control key 20, 22. The first protuberance 44 allows the control key 20, 22 to act as a lever. The first protuberance 44 serves as a bearing point of the lever formed by the control key 20, 22. The section of the control key 20, 22 comprised between the first protuberance 44 and the free end 38, 42 of the control lever 20, 22 forms a lever arm.

According to the illustrated embodiment, the first protuberance 44 also makes it possible to hold the printed circuit board 14, 16 against the mount 18. Alternatively, the first protuberance 44 can bear only on the mount 18, the printed circuit board 14, 16 being held on the mount 18 by other means such as for example holding pins integral with the mount and making it possible to hold the printed circuit board 14, 16.

The second protuberance 46 includes at its free end opposite the printed circuit board 14, 16 a bearing surface 54 in contact with a force sensor 50 arranged opposite on the printed circuit board 14, 16. When the control key 20, 22 is not pressed, that is to say when the control key 20, 22 is in a state of rest, the force sensor 50 is not subject to any pressure other than the natural pressure of the control key 20, 22. When the control key 20, 22 is pressed by an operator exerting a force for depressing the pressing zone 23, that is to say, when the control key 20, 22 is in an actuated state, the force sensor 50 is pressed and can transmit pressing force information to a processing unit (not illustrated).

In order to accentuate the pressure on the force sensor 50, the first protuberance 44, that is to say, the bearing point of the control key 20, 22, can bear only against the printed circuit board 14, 16.

The third protuberance 48 extends transversally along the entire length of the free end 38, 42 of the control key 20, 22. The third protuberance 48 comprises a free end 49 distant from the printed circuit board 14, 16. The distance between the free end 49 of the third protuberance 48 and the control key 20, 22 defines the possible pressing depth of the control key 20, 22. In other words, the height along the vertical axis of the third protuberance 48 can be adjusted so as to obtain the desired travel of the control key 20, 22.

The three protuberances 44, 46, 48 are integral with the control key 20, 22.

The control key 20, 22 comprises a zone of reduced thickness 51 between the first protuberance 44 and the second protuberance 46 so as to facilitate flexion of the pressing zone 23 when the control key 20, 22 is actuated. More particularly, according to the illustrated embodiment, the zone of reduced thickness 51 comprises a profile of diminishing thickness from the second protuberance 46 to the first protuberance 44. In other words, the minimum thickness of the control key 20, 22 is localized closest to the first protuberance 44 thus enabling the flexion of the control key 20, 22 to be localized when it is actuated at the pressing point. Also, this profile makes it possible to reinforce the rigidity of the second protuberance 46 of the control key 20, 22 so as to be able to exert in the most uniform manner possible a pressing force on the force sensor 50 when actuating the control key 20, 22.

According to FIG. 2, each printed circuit board 14, 16 is arranged beneath a control key 20, 22. It is nevertheless possible to replace the two illustrated circuit boards 14, 16 by a single printed circuit board.

According to FIG. 1 and FIG. 2, the force sensor 50 arranged on each printed circuit board 14, 16 is a piezoelectric type of sensor arranged in contact with the bearing surface 54 of the second protuberance 46. The piezoelectric sensor is used as a force sensor combining the properties of tactile sensor and haptic actuator. This arrangement, when the control key 20, 22 is in a state of rest, makes it possible to apply to the piezoelectric sensor an electrical signal so as to make the control key 20, 22 vibrate, in particular in order to generate a force feedback on the key acting as a perceptible acknowledgement on the control key 20, 22 by an operator after actuating the key.

Other force sensors 50 can be envisaged. Sensors not permanently bearing against the second protuberance 46 and therefore limiting the sensor to a role for triggering a function of the vehicle but not allowing an acknowledgement by force feedback can be envisaged. In this case, simple contact sensors can also be envisaged.

According to the illustrated embodiment, each printed circuit board 14, 16 comprises a cutout forming an elastic strip 56 on which each force sensor 50 is arranged. The elasticity of the strip 56 allows the pressure exerted by an operator on the force sensor 50 to be limited so as to protect it against an excessive pressure force deteriorating the force sensor 50. The elasticity of the strip 56 also allows, depending on the positioning of the force sensor 50 on the strip 56, the detection sensitivity of the force sensor 50 to be adjusted. It should be noted that the second protuberance 46 extends only above the strip 56 and not above the part of the printed circuit board 14, 16 that is beyond the strip so as not to abut the part of the printed circuit board 14, 16 that is beyond the strip when the control key 20, 22 is actuated by an operator.

Advantageously, in addition to the force sensor 50, each printed circuit board 14, 16 is equipped with a capacitive detection element 52 arranged beneath the pressing zone 23 of each control key 20, 22. The capacitive detection element 52 is of the deformable elastic type. According to the embodiment, the capacitive detection element 52 has an annular shape extending globally beneath the pressing zone 23. Of course, it is possible to arrange a capacitive detection element of a different shape; the essential is to be able to cover the pressing zone 23 as well as possible. It can be an elastomer charged with metal particles. The capacitive detection element 52 is arranged in contact with the pressing zone 23 of the control key 20, 22 and is electrically connected to the printed circuit board 14, 16. The capacitive detection element 52 can allow a preselection of a function associated with the control key 20, 22 when the control key 20, 22 is touched by an operator.

The arrangement of a capacitive detection element 52 beneath each control key 20, 22 can also prove to be particularly useful when the control keys 20, 22 are aligned as a row and when their adjacent lateral edges 30, 32 are delimited by a groove. According to this embodiment, the control keys 20, 22 of the same row all depress together when one of the control keys 20, 22 is pressed. In this configuration, it is possible to arrange a single force sensor 50 beneath the bearing surface 54 of a single second protuberance 46 of a single control key 20. The single force sensor 50 detects pressure on any one of the control keys 20, 22 of the row of control keys 20 22. The action on the force sensor 50 enables a function of the vehicle to be triggered, this function being associated with the pressing zone 23, actuated and detected by the capacitive detection element 52.

Also, each printed circuit board 14, 16 advantageously includes a light source 58 provided to illuminate the pictogram 24, 26 of each control key 20, 22. According to the illustrated embodiment, the light source 58 is arranged opposite the pictogram 24, 26 to be illuminated. The light source 58 is therefore surrounded by the capacitive detection element 52. In order to focus the light beam from the light source 58, a cavity 60 forming a light guide is arranged in the thickness ε of the control key 20, 22 beneath the pressing zone 23.

According to FIG. 1 and FIG. 2, in order to ensure uniform distribution of the pressure on the sensor during actuation of each control key 20, 22, the mount 18 includes a bump 62 which supports the zone of the printed circuit board 14, 16 on which the force sensor 50 is arranged. More precisely, according to the illustrated embodiment, the strip 56 of each printed circuit board 14, 16 rests on a bump 62 of the mount 18 beneath the force sensor 50.

Globally, a technical effect sought by such an assembly is to obtain a control panel 10 of very slight thickness. The use of flexible plastic material and also of flexible printed circuit boards 14, 16 allows such a control panel 10 to be used in many electronic control modules of the interior of a vehicle. The use of such a control panel 10 will be more particularly noted for vehicle roof electronic modules generally intended for illuminating the vehicle interior or for using such a control panel 10 for vehicle frontal electronic control modules such as controls of the multimedia device or air conditioning of the vehicle.

Figure 3:
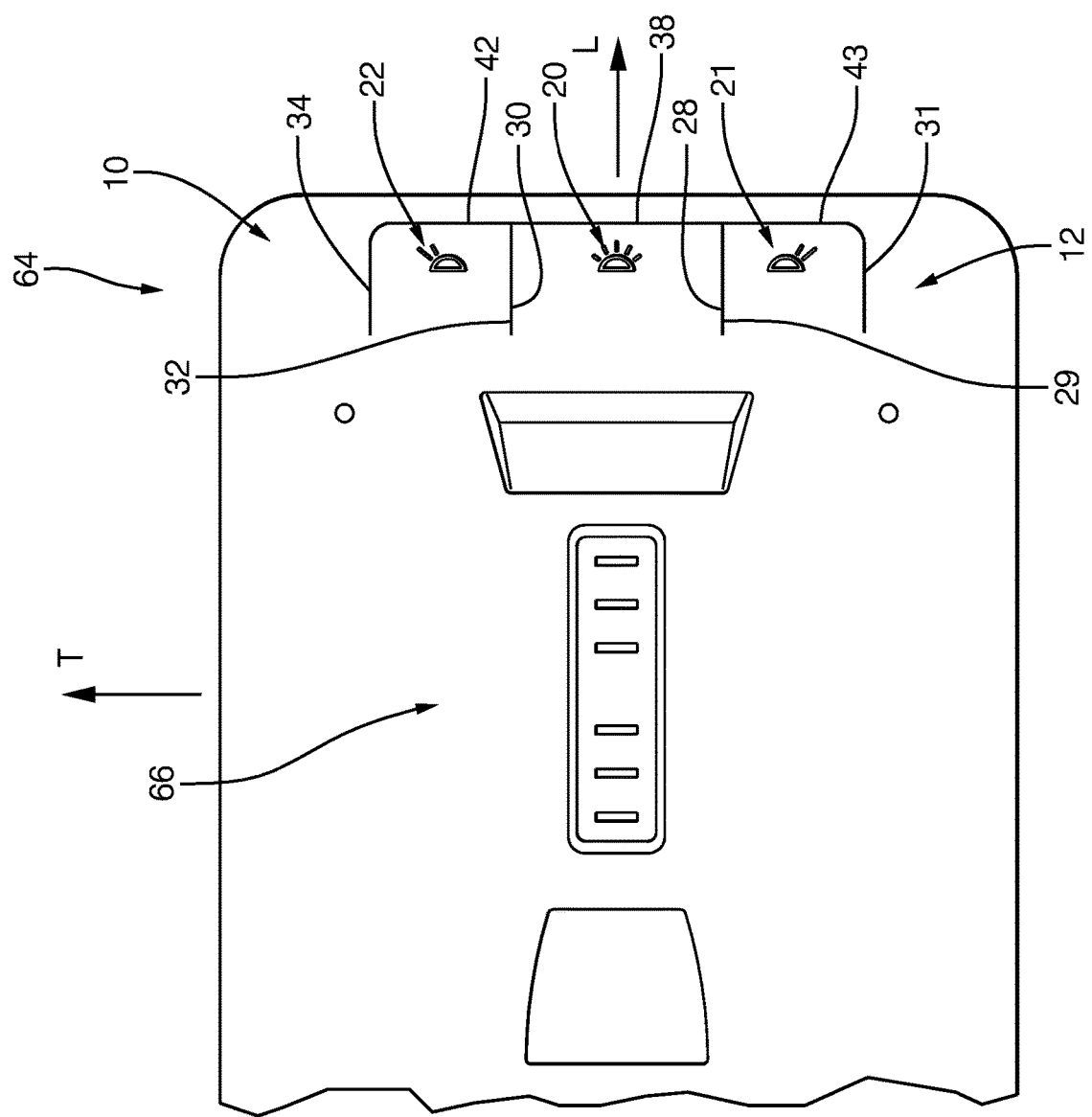
FIG. 3 is a diagrammatic view of a vehicle roof electronic module comprising the control panel of FIG. 1 equipped with three control keys.

FIG. 3 illustrates an embodiment of a roof electronic module 64 of a vehicle interior. This module is generally intended for illuminating the front seats of the vehicle. The roof electronic module 64 includes the control panel 10 of FIGS. 1 and 2, illustrated with a completing third control key 21. The three control keys 20, 21, 22 provide the lighting functions of the interior. The roof electronic module 64 also includes a zone equipped with lighting for the interior 66 of the vehicle. Briefly, the control panel 10 includes the three control keys 20, 21, 22 arranged as a row according to the invention. The three control keys 20, 21, 22 are composed of a central control key 20, comprising on either side of its lateral edges a first lateral key 21 on one hand and a second lateral key 22 on the other. The free edges 38, 42, 43 of these three control keys 20, 21, 22 are not coupled to the facade element 12 due to the rectilinear opening along the transversal direction of the facade element 12. This rectilinear opening extends longitudinally on either side of the row of control keys 20, 21, 22, thus delimiting the transversal edges 31, 34 of the first lateral key 21 and of the second lateral key 22, these edges not being adjacent to the central key 20.

The lateral edges 28, 30 of the central control key 20 are, according to the desired embodiment, either each separated by a longitudinal opening of the other lateral edges 29, 32 of the first and of the second lateral control key 21, 22, thus forming three control keys 20, 21, 22 independent of each other, or each separated by a longitudinal groove of the other lateral edges 29, 32 of the first and of the second lateral control key 21, 22, thus forming a set of three control keys 20, 21, 22, where the depression of one of the control keys 20 causes the depression of the other two 21, 22. In this latter case, the use of capacitive detection elements 52 beneath each pressing zone 23 of each control key 20, 21, 22 and the use of a single force sensor 50 arranged to bear against a second protuberance 46 of one of the three keys 20, 21, 22 can be envisaged.

I claim:

1. A control panel for motor vehicle, the control panel comprising:
    a mount;
    a printed circuit board fastened on the mount; and
    a facade element assembled on the mount and configured to cover the printed circuit board the facade element comprising at least one actionable control key that is integral with a fixed part of the facade element and that extends above a zone of the printed circuit board, the control key including an end joining the fixed part of the facade element and a mobile free end, wherein:
    the control key includes at its joining end a first protuberance bearing against the mount or against the printed circuit board, and includes at its free end a pressing zone provided to be touched by an operator with a view to actuating the control key;
    the control key also includes a second protuberance arranged between the first protuberance and the pressing zone, said second protuberance having a lesser height than the first protuberance and including at its free end opposite the printed circuit board a bearing surface provided to come into contact with a sensor arranged opposite on the printed circuit board when the control key is actuated; and
    the mount includes a bump arranged to bear against the printed circuit board and arranged beneath the sensor.

2. The control panel according to claim 1, wherein the printed circuit board includes a cutout forming an elastic strip on which the sensor is arranged.

3. The control panel according to claim 1, wherein the control key comprises a zone of a reduced thickness between the first protuberance and the second protuberance so as to facilitate flexion of the pressing zone when the control key is actuated.

4. The control panel according to claim 3, wherein the zone of the reduced thickness comprises a profile of a diminishing thickness from the second protuberance to the first protuberance.

5. The control panel according to claim 1, wherein a light source is arranged on the printed circuit board opposite the pressing zone and in that a cavity forming a light guide is arranged in a thickness of the control key beneath the pressing zone so as to be able to illuminate a pictogram arranged on the pressing zone.

6. The control panel according to claim 1, wherein the control key comprises a third protuberance arranged beneath the free end of the control key and having its free end distant from the printed circuit board so as to form a stop against the printed circuit board when the control key is actuated.

7. The control panel according to claim 1, wherein an elastic capacitive detection element is arranged interposed between the pressing zone of the control key and the printed circuit board, the elastic capacitive detection element being arranged in contact with the control key and electrically connected to the printed circuit board so as to detect a touch of the control key by an operator.

8. The control panel according to claim 1, wherein the sensor is a force sensor arranged in contact with the bearing surface of the second protuberance.

9. The control panel according to claim 8, wherein the force sensor is simultaneously a tactile sensor and a haptic actuator.

10. The control panel according to claim 1, wherein the facade element comprises a plurality of control keys aligned edge to edge consecutively one after the other such that their joining ends are aligned with each other in a rectilinear manner and such that their free ends are aligned with each other in a rectilinear manner; and in that two consecutive control keys are separated by a hollowing of the facade element extending from their free ends up to their joining ends.

11. The control panel according to claim 1, wherein the facade element comprises a plurality of control keys aligned edge to edge consecutively one after the other such that their joining ends are aligned with each other in a rectilinear manner and such that their free ends are aligned with each other in a rectilinear manner; and in that two consecutive control keys are separated by a groove of the facade element extending from their free ends up to their joining ends.

12. A roof electronic module for a motor vehicle interior, the roof electronic module comprising a control panel, the control panel comprising:
  a mount;
  a printed circuit board fastened on the mount; and
  a facade element assembled on the mount and configured to cover the printed circuit board, the facade element comprising at least one actionable control key that is integral with a fixed part of the facade element and that extends above a zone of the printed circuit board, the control key including an end joining the fixed part of the facade element and a mobile free end,
  wherein:
    the control key includes at its joining end a first protuberance bearing against the mount or against the printed circuit board, and includes at its free end a pressing zone provided to be touched by an operator with a view to actuating the control key;
    the control key also includes a second protuberance arranged between the first protuberance and the pressing zone, said second protuberance having a lesser height than the first protuberance and including at its free end opposite the printed circuit board a bearing surface provided to come into contact with a sensor arranged opposite on the printed circuit board when the control key is actuated; and
    the mount includes a bump arranged to bear against the printed circuit board and arranged beneath the sensor.

13. The roof electronic module of claim 12, wherein the printed circuit board includes a cutout forming an elastic strip on which the sensor is arranged.

14. The roof electronic module of claim 12, wherein the control key comprises a zone of a reduced thickness between the first protuberance and the second protuberance so as to facilitate flexion of the pressing zone when the control key is actuated.

15. The roof electronic module of claim 14, wherein the zone of the reduced thickness comprises a profile of a diminishing thickness from the second protuberance to the first protuberance.

16. The roof electronic module of claim 12, wherein a light source is arranged on the printed circuit board opposite the pressing zone and in that a cavity forming a light guide is arranged in a thickness of the control key beneath the pressing zone so as to be able to illuminate a pictogram arranged on the pressing zone.

17. The roof electronic module of claim 12, wherein the control key comprises a third protuberance arranged beneath the free end of the control key and having its free end distant from the printed circuit board so as to form a stop against the printed circuit board when the control key is actuated.

18. The roof electronic module of claim 12, wherein an elastic capacitive detection element is arranged interposed between the pressing zone of the control key and the printed circuit board, the elastic capacitive detection element being arranged in contact with the control key and electrically connected to the printed circuit board so as to detect a touch of the control key by an operator.

19. The roof electronic module of claim 12, wherein the sensor is a force sensor arranged in contact with the bearing surface of the second protuberance.

\* \* \* \* \*